United States Patent [19]

Isobe et al.

[11] Patent Number: 4,833,652
[45] Date of Patent: May 23, 1989

[54] SEMICONDUCTOR MEMORY DEVICE HAVING A SELF-DIAGNOSING FUNCTION

[75] Inventors: Mitsuo Isobe, Yokohama; Tohru Kimura, Sagamihara, both of Japan

[73] Assignee: Kabushiki Kaisha Toshiba, Kawasaki, Japan

[21] Appl. No.: 171,860

[22] Filed: Mar. 22, 1988

[30] Foreign Application Priority Data

Mar. 27, 1987 [JP] Japan .................................. 62-73325

[51] Int. Cl.⁴ ......................... G11C 7/00; G11C 29/00
[52] U.S. Cl. .................................... 365/201; 365/200
[58] Field of Search ................. 365/200, 201; 371/21, 371/5

[56] References Cited

U.S. PATENT DOCUMENTS

| | | | |
|---|---|---|---|
| 3,940,740 | 2/1976 | Coontz | 365/200 |
| 3,962,687 | 6/1976 | Suzumura et al. | 365/200 |
| 4,414,665 | 11/1983 | Kimura et al. | 365/201 |
| 4,587,638 | 5/1986 | Isobe et al. | 365/200 |

OTHER PUBLICATIONS

IBM Technical Disclosure Bulletin—vol. 12, No. 6, Nov. 1969, p. 895.
Kokkonen et al., "Redundancy Techniques for Fast Static RAMs," IEEE International Solid-State Circuits Conference, ISSCC Digest of Technical Papers, pp. 80–81, Feb. 18, 1981.

Primary Examiner—James W. Moffitt
Attorney, Agent, or Firm—Finnegan, Henderson, Farabow, Garrett & Dunner

[57] ABSTRACT

A defect detection circuit for detecting a defect of a memory cell, a counter for counting defects detected by the defect detect circuit, and a remediableness determination unit for determining whether a count of the counter allows remedy by a redundancy circuit, are provided in a tester for a semiconductor memory or on a memory chip having a redundancy circuit. When the count of the counter is the same as or smaller than the number of at least one of the auxiliary rows and columns of the redundancy circuit, the memory is determined to be "remediable." Otherwise, the memory is determined to be "unremediable." When the count of the counter exceeds the number of at least one of the auxiliary rows and columns of the redundancy circuit, the memory test is interrupted.

8 Claims, 5 Drawing Sheets

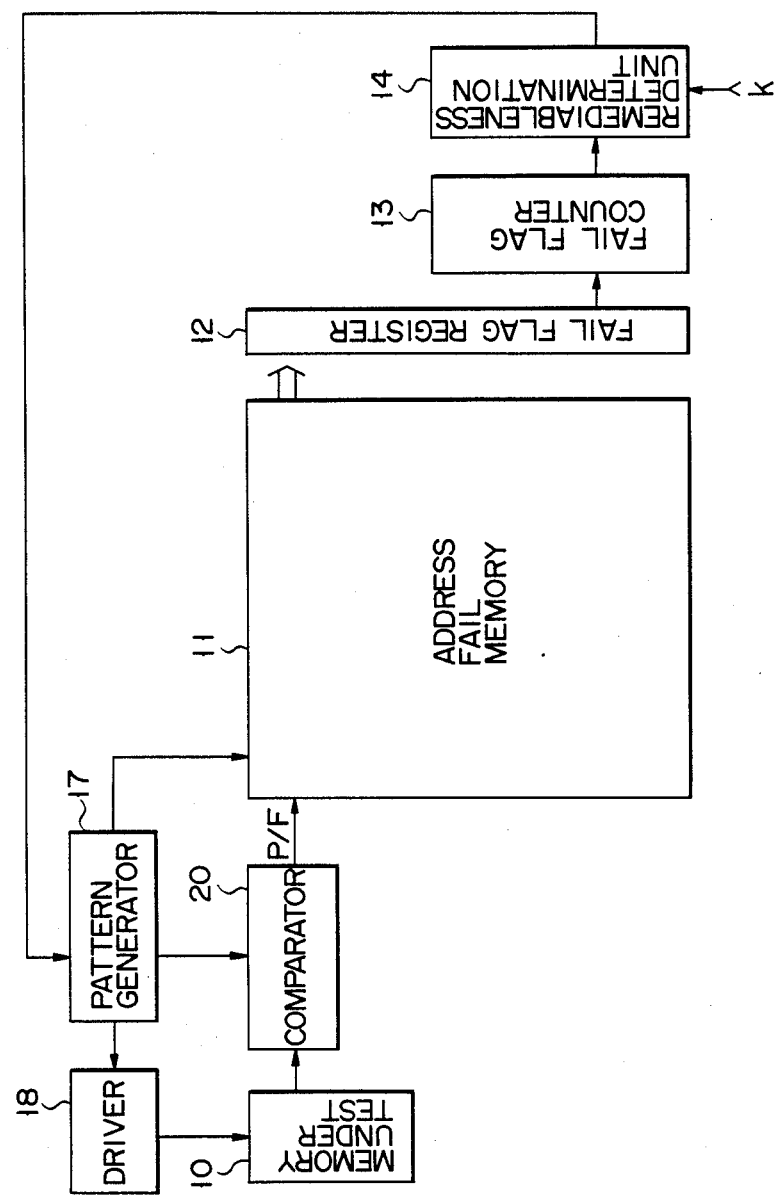
F I G. 3

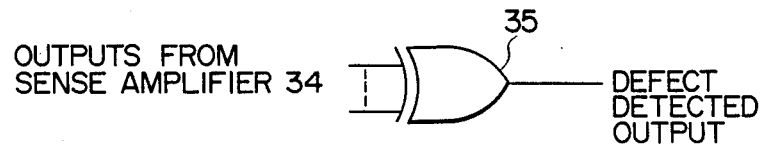
F I G. 5
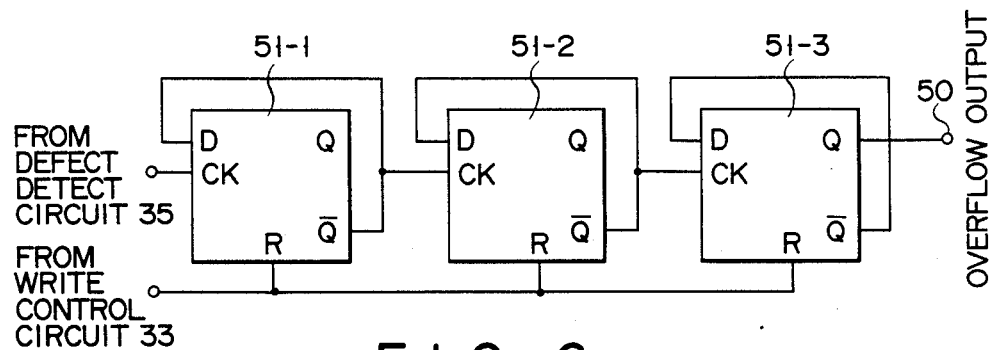
F I G. 6
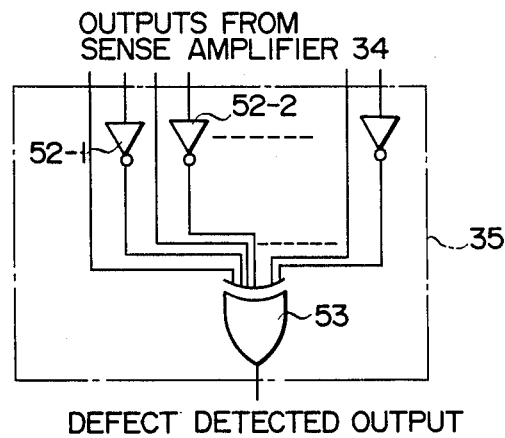
F I G. 7

SEMICONDUCTOR MEMORY DEVICE HAVING A SELF-DIAGNOSING FUNCTION

BACKGROUND OF THE INVENTION

1. Field of the Invention

The present invention relates to a test apparatus for a memory with a redundancy circuit and, more particularly, to a test apparatus for rapidly determining whether a defective chip can be remedied using a redundancy circuit.

2. Description of the Related Art

In recent years, a redundancy circuit technique has become essential as capacities of semiconductor memories increase. A redundancy circuit adds memory cells of an auxiliary row or colunn to a normal memory array. When a defective row or column or a defective bit is present in the normal memory array, the redundancy circuit replaces it with the above auxiliary row or column, thereby remedying a defective chip.

Conventionally, whether a defective chip can be remedies is determined using the redundancy circuit as follows. That is, an operation test of a completed semiconductor memory is performed using a semiconductor memory tester. In this case, a determination result of operability of the memory under test is fetched in a unit called an address fail memory in the semiconductor memory tester. The address fail memory has the same capacity as a larger capacity than that of the memory under test. Thereafter, whether the defective chip can be remedied is determined in accordance with a suitable algorithm corresponding to the number of auxiliary rows or columns of the memory under test. In a normal defect remedy algorithm, the auxiliary rows or columns are sequentially assigned to rows or columns from one having a largest number of defective bits, thereby performing remedy determination by determining whether the number of the rows or columns is sufficient.

In a semiconductor memory, the first test is performed after manufacturing steps for respective semiconductor elements which constitute the memory are finished. When a defective memory cell is present, a program of a redundancy control circuit is executed to remedy the cell. After the program is executed, the semiconductor memory is tested again and various assembly steps are peformed for good memories only. In the first test, a complicated test is performed under strict conditions in order to reduce the frequency of occurrence of defects in the subsequent steps.

However, in a determination method according to the conventional technique, whether the defective chip can be remedied is determined after the operation test for the memory under test is finished. For this reason, in order to determine whether the defective chip can be remedied using the redundancy circuit, a time obtained by adding a time for the operation test of the memory under test to a time for determining remediableness on the basis of the operation test result, Since this test is performed after the manufacturing steps of the respective semiconductor elements are finished, it is performed regardless of whether a memory is good or defective. In addition, if a memory is defective, the test is performed regardless of whether the memory can be remedied by the redundancy circuit. Therefore, the test time is undesirably prolonged. In general, determination of remediableness of a memory under test using the redundancy circuit must be performed for a large number of chips in the form of a wafer. Therefore, even when a chip is determined to be unremediable because the number of defective bits is too large and, therefore, is excluded, it is inefficient to carry out the above determination for all remaining chips. Especially, carrying out of the above test to a large number of chips in a manufacturing line is inefficient and increases manufacturing cost. In addition, since recent semiconductor memories have a large capacity, are operated at a high speed, and are highly functional, a tester for these memories must have high quality and therefore is expensive. Since such a tester is used for a long period of time, cost for the test is undesirably increased.

SUMMARY OF THE INVENTION

It is, threfore, an object of the present invention to provide a test apparatus for a memory with a redundacy circuit which can reduce a test time and cost required for the test.

According to an aspect of the present invention, there is provided a test apparatus for a memory, comprising: a defect detect circuit for detecting a defect of a memory under test; a counter circuit for counting the number of defects detected by the defect detect circuit; a determination circuit for determining whether a count of the counter circuit allows remedy by a redundancy circuit; and an output circuit for outputting a determination result of the determination circuit.

With the above arrangement, in a memory including a redundancy circuit, determination of remediableness of a defective chip can be performed simultaneously with an operation test of a memory under test, and therefore remediableness determination and an address which requires remedy can be obtained at the same time the operation test is finished. As a result, there is provided a test apparatus of a memory with a redundancy circuit which can reduce a test time and cost required for the test.

BRIEF DESCRIPTION OF THE DRAWINGS

FIG. 3 is a block diagram of an arrangement of a semiconductor memory tester including the test apparatus according to a third embodiment of the present invention;

FIG. 5 is a circuit diagram of an arrangement of a defect detect circuit in the circuit shown in FIG. 4;

FIG. 6 is a circuit diagram of an arrangement of a counter in the circuit shown in FIG. 4; and FIG. 7 is a circuit diagram of another arrangement of the defect detect circuit in the circuit shown in FIG. 4.

DETAILED DESCRIPTION OF THE PREFERRED EMBODIMENTS

Figure 1:
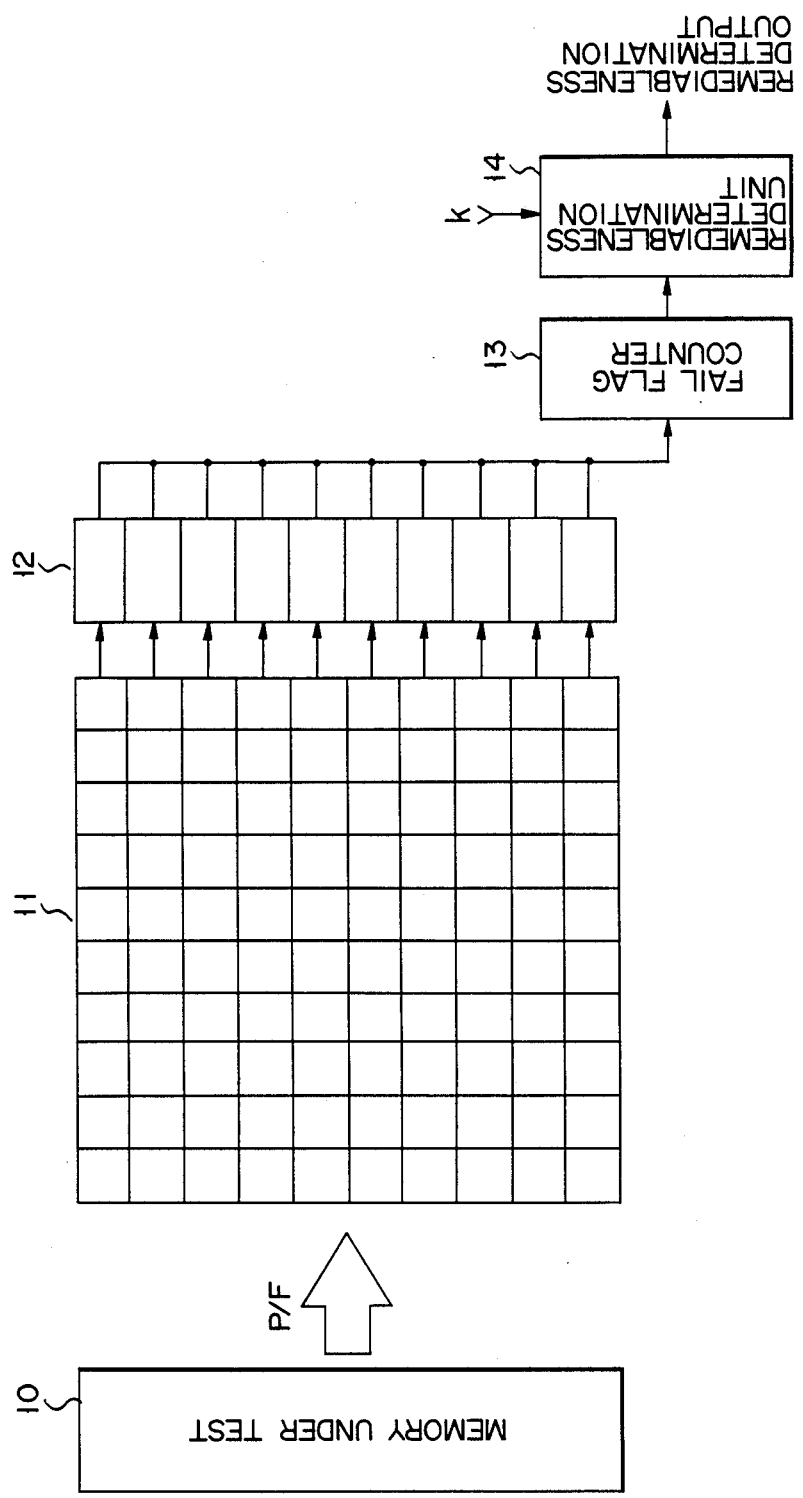
FIG. 1 is a block diagram for explaining a test apparatus for a memory with a redundancy circuit according to a first embodiment of the present invention.

FIG. 1 shows an arrangement of semiconductor memory under test (to be referred to as MUT hereinafter) 10 having a matrix of n rows x m columns and k auxiliary rows. Pass/fail information P/F at each address obtained by an operation test of MUT 10 is sequentially input at an address of address fail memory (to be referred to as AFM hereinafter) 11 corresponding to the address in MUT 10 in units of bits. A memory capacity of AFM 11 is the same as or larger than that of MUT 10. Information P/F input at arbitrary addresses of AFM 11 have the same order as that of a test pattern during the operation test of MUT 10. In this case, the information is input from address 0 at an upper left corner of AFM 11 in a row direction.

Information P/F at each address of MUT 10 is sequentially input at the address of AFM 11 from address 0 in the row direction as follows. That is, when fail information is input, "1" is written in a corresponding address of AFM 11. In this case, "1" is set in fail flag register 12, which corresponds to the respective rows of AFM 11, at a position corresponding to a row of the n rows in which a defect is present. As a result, a position of the row having a defective bit can be obtained. Then, "1" of register 12 is counted by fail flag counter 13. A count of counter 13 represents the number of defective rows. This number is input to remediableness determination unit 14, and the redundancy circuit determines whether the defective chip can be remedied. In this case, number k of the auxiliary rows is input in unit 14 in advance. When the count of counter 13 exceeds number k, the defective chip cannot be remedied. When the count is equal to or smaller than number k, the chip can be remedied. This determination result is output from unit 14 as a remediableness determination output.

By repeatedly performing the above operation each time information P/F at each address of MUT 10 is input, the redundancy circuit can determine whether a defective chip can be remedied simultaneously with the operation test of MUT 10. When the redundancy circuit determines that the chip can be remedied, information in register 12 is output to obtain a defect address requiring remedy simultaneously with the operation test of MUT 10.

Figure 2:
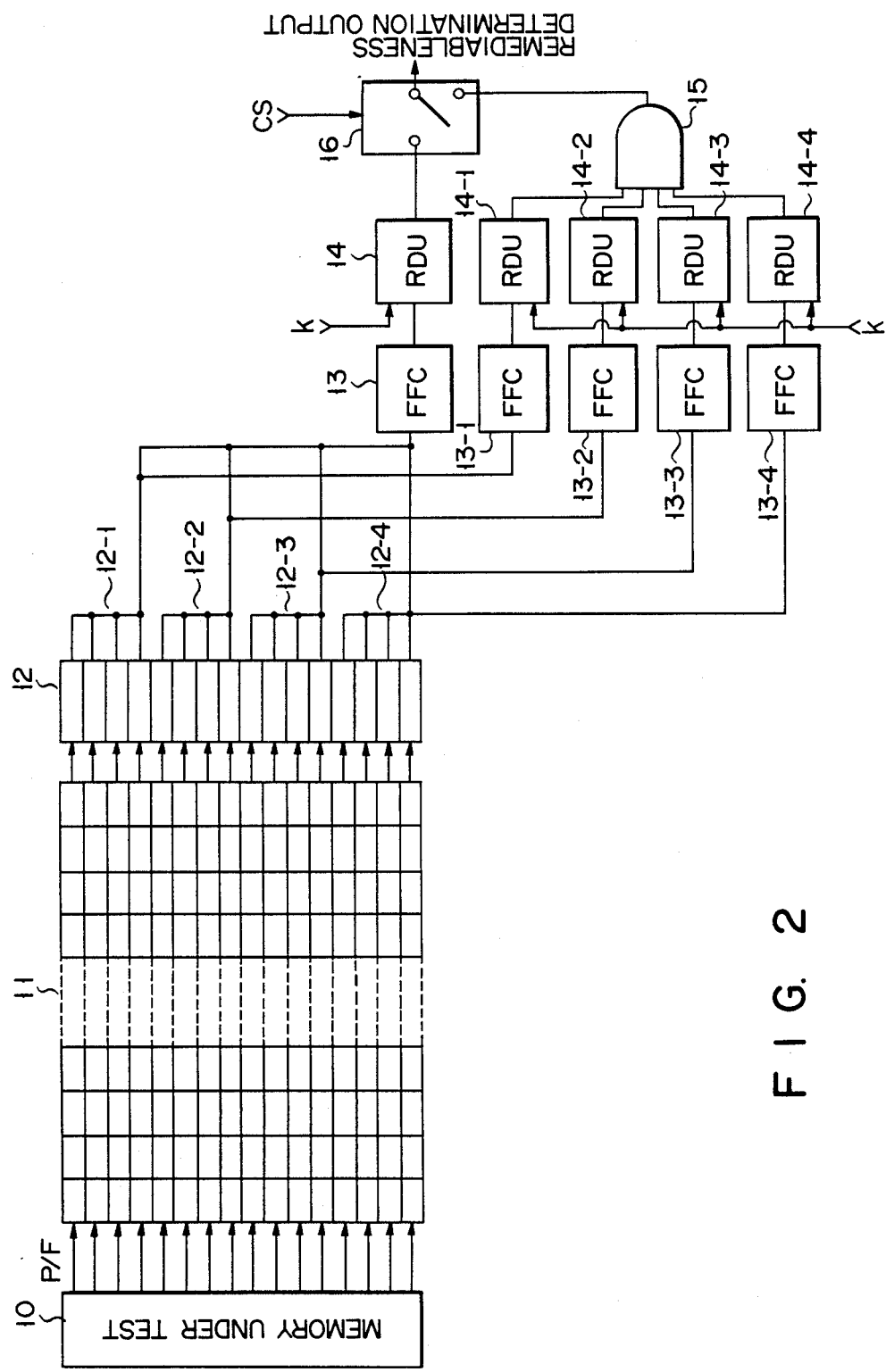
FIG. 2 is a block diagram for explaining the test apparatus of a memory with a redundancy circuit according to a second embodiment of the present invention.

FIG. 2 shows an arrangement of the test apparatus which can perform a test even when addresses to be replaced with auxiliary rows are limited, i.e., when the MUT has a multi-bit arrangement (in this case, four bits). The same parts as in FIG. 1 are represented by the same reference numerals in FIG. 2, and a detailed description thereof will be omitted. In this test apparatus, as shown in FIG. 2, fail flag register 12 is divided into a plurality of blocks 12-1 to 12-4. Fail flag counters (FFC) 13-1 to 13-4 are provided to correspond to blocks 12-1 to 12-4, respectively. A count output from each of counters 13-1 to 13-4 and a number k of auxiliary rows are supplied to a corresponding one of remediableness determination units (RDU) 14-1 to 14-4. Outputs from units 14-1 to 14-4 are supplied to and ANDed by AND gate 15. An AND output from AND gate 15 is a remediableness determination output. This output signal may be singly used or connected to switch 16 so that this signal and an output signal from remediableness determination unit 14 are selectively output in response to control signal CS. In the latter case, switch 16 is controlled by signal CS to select the output from unit 14 when MUT 10 has a 1-bit arrangement and to select the output from AND gate 15 when MUT 10 has a multi-bit (4-bit) arrangement. With this arrangement, when the number of divided blocks of register 12 is arbitrarily determined, this test arrangement can be applied to and MUT 10 regardless of the number of bits.

FIG. 3 shows an arrangement of a tester for a semiconductor memory including the test apparatus of the present invention. In FIG. 3, the same parts as in FIGS. 1 and 2 are represented by the same reference numerals.

Test pattern data output from pattern generator 17 is supplied to and written in MUT 10 through driver 18. Data read out from MUT 10 and the test pattern data output from generator 17 are compared with each other by comparator 20. A comparison output from comparator 20 is written in AFM 11 as pass/fail information P/F. That is, information P/F at each address obtained by an operation test of MUT 19 is sequentially input at an address of AFM 11 corresponding to the address of MUT 10 in units of bits. An order of information P/F input at arbitrary addresses may be the same as that of a test pattern. In this case, information P/F is sequentially input from address 0 at an upper left corner of AFM 11 in a row direction. Information P/F at each address of MUT 10 is sequentially input from address 0 of AFM 11 in a row direction as follows. That is, when fail information is input, "1" is written at a corresponding address of AFM 11. In this case, "1" is set in fail flag register 12 corresponding to the respective rows of AFM 11 at a position corresponding to a row of the n rows in which a defect is present. As a result, a position of the row having a defect can be obtained. Then, "1" of register 12 is counted by fail flag counter 13. A count of counter 13 represents the number of defective rows. This number is input to remediableness determination unit 14, and the redundancy circuit determines whether a defective chip can be remedied. In this case, number k of auxiliary rows is input to unit 14 in advance. When the count of counter 13 is smaller than number k, the chip can be remedied, when the count exceeds number k, the chip cannot be remedied. This determination result is output from unit 14 as a remediableness determination output and supplied to generator 17. When the number of defective rows exceeds number k of auxiliary rows and unit 14 determines that the defective chip cannot be remedied, an operation of generator 17 is stopped, and the test is interrupted.

According to the tester for a semiconductor memory having the above arrangement, the redundancy circuit can determine whether a defective chip can be remedied simultaneously with the operation test of MUT 10. In addition, a defective address can be obtained from register 12. For this reason, a test time can be greatly reduced, and therefore test cost is reduced. Furthermore, by supplying the remediableness determination output from unit 14 to generator 17 to control the operation of generator 17, the operation test of MUT 10 can be interrupted when the chip is determined to be unremediable. Therefore, since no useless test is performed, the test time can be greatly reduced.

Note that in the above embodiments, rows of the memory cell are remedied. However, it is a matter of course that one or both of rows and columns could also be remedied.

Figure 4:
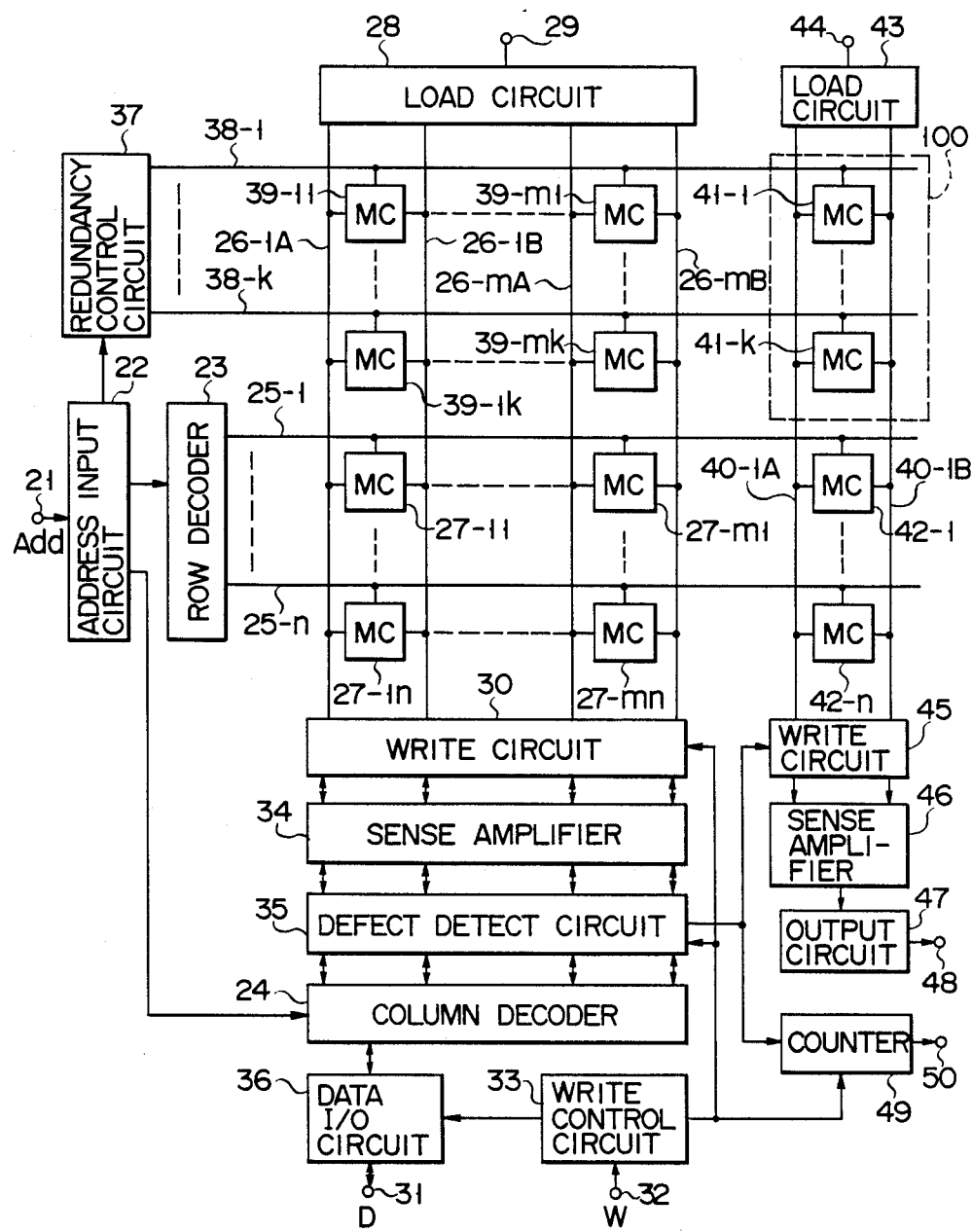
FIG. 4 is a block diagram for explaining the test apparatus for a memory with a redundancy circuit according to a fourth embodiment of the present invention.

FIG. 4 shows a fourth embodiment of the present invention. In this embodiment, a defect detecting means, a counting means, and an output means are formed together with a semiconductor memory on a single chip. Therefore, the chip itself of the semiconductor memory has a remediableness determination function.

Address input terminal 21 receives address signal Add for selecting a specific memory cell from a plurality of memory cells arranged in a matrix manner. Signal Add supplied to terminal 21 is supplied to address input circuit 22. An output signal from circuit 22 is supplied to row decoder 23 and column decoder 24. An output from decoder 23 is supplied to word lines 25-1 to 25-n for selecting a row direction of the plurality of memory cells. Bit line pairs 26-1A and 26-1B to 26-mA and 26-mB are provided in a direction perpendicular to a direction of word lines 25-1 to 25-n. Each of memory cells 27-11 to 27-mm is located at a corresponding one of intersections of bit line pairs 26-1A and 26-1B to 26-mA and 26-mB and word lines 25-1 to 25-n. Load circuit 28 charges bit line pairs 26-1A and 26-1B to 25-mA and 26-mB. Power source terminal 29 is connected to load circuit 28. Write circuit 30 writes data D intput to data I/O terminal 31 in memory cell 27-ij selected by signal Add. Write circuit 30 is controlled by write control signal W input to write control terminal 32 and an output from write control circuit 33. Sense amplifier 34 amplifies a small potential difference output from selected cell 27-ij (i is an integer from 1 to m, and j is an interger from 1 to n) to bit line pairs 27-iA and 27-iB at high speed. Defect detect circuit 35 determines a defect of cells 27-11 to 27-mn. Data I/O circuit 36 supplies an output from sense amplifier 34 to an external circuit through terminal 31 and input data D from the external circuit. Redundancy control circuit 37 is connected to address input circuit 22 and receives signal Add. Redundancy control circuit 37 is also connected to redundancy word lines 38-1 to 38-k. Lines 38-1 to 38-k are provided across bit line pairs 26-1A and 26-1B to 26-mA and 26-mB. Each of redundancy memory cells 39-11 to 39-mk is located at a corresponding one of intersections of redundancy word lines 38-1 to 38-k and bit line pairs 26-1A and 26-1B to 25-mA and 26-mB. When a defect is found at an address of memory cells 27-11 to 27-mn, a corresponding one of memory cells 39-11 to 39-mk stores data in place of a defective memory cell. This replacement of memory cells is performed by redundancy control circuit 37.

Bit line pair 40-1A and 40-1B is provided across word lines 25-1 to 25-n and redundancy word lines 38-1 and 38-k. Each of memory cells 41-1 to 41-k is located at a corresponding one of intersections of bit line pair 40-1A and 40-1B and word lines 38-1 to 38-k. When a defect is found, cells 42-1 to 42-n store information about the defect. Load circuit 43 is connected to one end of each of bit lines 40-1A and 40-1B, and power source terminal 44 is connected to circuit 43. Write circuit 45 is connected to the other end of each of lines 40-1A and 40-1B. Circuit 45 is controlled by an output from detect circuit 35, and when a defect is found, circuit 45 writes information about a defect in cells 42-1 to 42-n. Sense amplifier 46 amplifies a potential difference between bit lines 40-1A and 40-1B. Output circuit 47 outputs a signal amplified by sense amplifier 46 through output terminal 48. A count operation of counter 49 is controlled by an output from write control circuit 33, and when defects are found by defect detect circuit 35, counter 49 counts the number of defects. Terminal 50 outputs a signal representing overflow of counter 49.

An operation of the semiconductor memory shown in FIG. 4 will be described below. First, an operation of writing data D in memory cells 27-11 to 27-mn will be described. Address signal Add is input from address input terminal 21 to address input circuit 22. An output from circuit 22 is decoded by row decoder 23 to select one word line 25-j. As a result, memory cells 27-1j, 27-2j, ... connected to selected line 25-j are selected. When an output from circuit 22 is decoded by column decoder 24, one bit line pair 26-iA and 26-iB are selected. Input data D supplied to data I/O terminal 31 is supplied to bit line pair 26-iA and 26-iB through data I/O circuit 36 and write circuit 30. Data D is written in one memory cell 27-ij selected by selected bit line pair 26-iA and 26-iB and selected word line 25-j.

A read operation will be described below. That is, when one word line 25-j is selected as in the write operation, memory cells 27-1j, 27-2j, ... connected to word line 25-j are selected, and stored data in cells 27-1j, 27-2j, ... appear on bit line pairs 26-1A and 26-1B, 26-2A and 26-2B, ... as a small potential difference. This small potential difference is amplified by sense amplifier 34, and only the data on bit line pair 26-iA and 26-iB selected by column decoder 24 is output to data I/O terminal 31 through data I/O circuit 36.

The above write/read operation test is performed to all memory cells 27-11 to 27-mn. Redundancy control circuit 37 is programmed such that if a defect is found in given memory cell 27-pq (p is an integer from 1 to m, and q is an integer from 1 to n), redundancy word line 38-1 is selected in place of word line 25-q connected to defective cell 27-pq when address signal Add for selection defective cell 27-pq is supplied. In this program, a method of melting a fuse formed of polysilicon by a laser is normally used. Thus, when an address selecting defective cell 27-pq is input, the row of redundancy memory cells 39-11 to 39-ml is selected in place of a row including defective cell 27-pq, and a circuit operation is performed as in a nondefective chip. Therefore, the write/read operation can be performed as in a normal memory cell. When a plurality of defective memory cell rows are present, redundancy word lines 38-2 to 38-k are sequentially selected to take place of the defective memory cell rows.

A test of this circuit will be described below. First, predetermined data (e.g., all "0"s or "1"s) are written in all memory cells 27-11 o 27-mn as in the above write operation. At this time, the contents of counter 49 are reset by write control signal W. Then, address signal Add is supplied to address input terminal 21. As a result, all word lines 25-1 to 25-n are sequentially selected using address input circuit 22 and row decoder 23. In this case, the contents of all memory cells 27-1y to 27-my selected by one word line 25-y (y is an integer from 1 to n) are transmitted to sense amplifier 34 through bit line pair 26-xA and 26-xB. Amplifier 34 amplifies this information and supplies an amplifier output to defect detect circuit 35. Detect circuit 35 includes an exclusive OR gate to which all outputs from amplifier 34 selected by one word line are input, as shown in FIG. 5. When all data read out from cells 27-1y to 27-my are correct, detect circuit 35 outputs "0". When at least one of the readout data from cells 27-1y to 27-m is detect circuit 35 outputs "1," which represents that a defect is found in a memory cell. When "1" is output, counter 49 increments the number of defects, i.e., the number of "1"s. Simultaneously, write circuit 45 writes information of "1" in memory cell 42-y selected by word line 25-y, which is the same word line used by the read operation. This information of "1" is output to output terminal 48 through sense amplifier 46 and output circuit 47.

The above read operation is performed for cells 27-11 to 27-mn by sequentially changing address signal Add so as to select all word lines 25-1 to 25-n. At this time, counter 49 counts defects each time the defects are found in cells 27-11 to 27-mn. When a count exceeds the number of redundancy memory cells (spare), counter 49 outputs a signal representing overflow from output terminal 50. When this signal is output, defects are present in the number larger than that of the memory cells for remedying defects and hence cannot be remedied. Therefore, this chip need not be tested any longer. When the number of defects falls within the range of the number of spares, defects of the chip can be remedied. Therefore, a program step in which a fuse of redundancy control circuit 37 is melted to connect redundancy memory cells 39-11 to 39-mk may be executed. In this case, if an address accessed when the signal representing a defect is output during the above read operation test is stored in the tester, an address representing a defective memory cell for performing this program can be obtained by referring to the stored contents. Similarly, after the above test, by outputting the contents of memory cells 42-1 to 42-n from output terminal 48 through amplfier 46 and output circuit 47 while writing given data in all memory cells 27-11 to 27-mn and checking an address having data of "1", an address of a defective memory cell can be obtained.

FIG. 6 is a block diagram of an arrangement of counter 49 in the circuit of FIG. 4 when four auxiliary rows for remedying a defect are present. This circuit is a binary counter obtained by serially connecting three D flip-flops known to those skilled in the art. In this counter, all flip-flops 51-1 to 51-3 are reset by an output from write control circuit 33 during a first write operation of a test. Then, a signal of "1" representing a defect and output from defect detect circuit 35 is supplied to a counter input terminal (clock input teminal CK of flip-flop 51-1), and the number of defects are counted. When the number of defects becomes five, "1" is output to output terminal 50.

Note that in the above fourth embodiment, the data to be initially written in all the memory cells are all "0"s to "1"s. However, in order to obtain a checkerboard pattern in which data are different in every other row, defect detect circuit 35 shown in FIG. 5 may have an arrangement shown in FIG. 7. That is, exclusive OR gate 53 may receive outputs from amplifier 34 that are inverted by inverters 52-1, 52-2, ... in every other row.

With the above arrangement, by adding defect detect circuit 35, counter 49 for counting defects, output terminal 50 for informing overflow of counter 49, memory cells 42-1 to 42-n, sense amplifier 46 for reading out the contents of cells 42-1 to 42-n, output circuit 47, and output terminal 48 to a semiconductor memory, a chip can be determined to be good or defective by only a simple write/read test. If counter 49 overflows during the test, the test is no longer performed, thereby reducing a test time. Furthermore, since this simple test does not require an expensive tester and the test time is reduced, test cost can be reduced.

Note that even if auxiliary memory cells 41-1 to 41-k represented by broken line 100 in FIG. 4 are omitted, the function of the present invention is not degraded at all. That is, memory cells are generally arranged in a matrix manner, the above auxiliary cells 100 are shown only to arrange the memory cells in the above embodiments in the matrix manner.

As has been described above, according to the present invention, in a memory having a redundancy circuit, remediableness of a defective chip can be determined simultaneously with an operation test of a memory under test, and remediableness determination and an address which requires remedy can be obtained at the same time the operation test is ended. Therefore, a test apparatus for a memory with a redundancy circuit which can reduce a test time and cost required for the test can be obtained.

What is claimed:

1. A semiconductor memory device having a self-diagnosing function, comprising:
    a memory cell array having memory cells arranged in rows connected to row lines and columns connected to column lines;
    a redundancy memory cell array having redundancy memory cells arranged in rows connected to said row lines and columns connected to said column lines;
    address input means for supplying an address signal;
    row decoder means responsive to said address signal for selecting one of said row lines;
    column decoder means responsive to said address signal for selecting one of said column lines, wherein a selected memory cell is connected to said selected row and column lines;
    first writing means for writing data into said selected memory cell;
    first sense amplifier means for reading and amplifying data written to said selected memory cell;
    data input/output means for controlling said first writing means and said first sense amplfier means;
    defect detecting means for determining whether said data read from said memory cell array is defective and for producing defect information indicating defective memory cells;
    defect information storing memory cells for storing said defect information;
    second writing means connected to said defect detecting means for writing said defect information into said defect information storing memory cells;
    second sense amplifier means connected to said second writing means for reading and amplifying said stored defect information;
    defect information output means connected to said second sense amplifier means for outputting said amplfier defect information;
    redundancy control means for selecting one of said redundancy memory cells in place of a defective memory cell indicated by said output defect information;
    counter means connected to said defect detecting means for generating a count of detected defective memory cells; and
    output means for indicating that said count of said counter means is greater than a predetermined number equal to one of a number of rows and a number of columns of said redundancy memory cell array.

2. The semiconductor memory device according to claim 1, wherein said defect detecting means includes means for comparing, in one read-out cycle, said stored data of said memory cells connected to said selected row line.

3. The semiconductor memory device according to claim 1, wherein said defect detecting means comprises an exclusive OR circuit for receiving, in one read-out cycle, said stored data of said memory cells connected to said selected row line.

4. The semiconductor memory device according to claim 1, wherein said defect detecting means includes an exclusive OR circuit for exclusive ORing said stored data of said selected row, wherein every other of said stored data are inverted before being supplied to said exclusive OR circuit.

5. The semiconductor memory device according to claim 1, wherein each row of said memory cell array includes a single defect information storing memory cell.

6. The semiconductor memory device according to claim 1, wherein said counter means includes a counter for generating said count and for generating an overflow signal when the count exceeds said predetermined number.

7. The semiconductor memory device according to claim 6, wherein said counter is reset by an external write control signal.

8. The semiconductor memory device according to claim 6, wherein said counter is a binary counter including a serially connected plurality of D flip-flops.

* * * * *